United States Patent [19]
Byrd et al.

[11] Patent Number: 6,006,543
[45] Date of Patent: *Dec. 28, 1999

[54] ABSORBENT PAIR REFRIGERANT SYSTEM

[75] Inventors: Charles M. Byrd, Maumelle, Ark.; Dennis M. Pfister; Ted W. Warriner, both of Conway, Ark.

[73] Assignee: Sun Microsystems, Inc., Palo Alto, Calif.

[*] Notice: This patent is subject to a terminal disclaimer.

[21] Appl. No.: 09/182,608

[22] Filed: Oct. 29, 1998

Related U.S. Application Data

[63] Continuation of application No. 08/811,759, Mar. 6, 1997, Pat. No. 5,855,121, which is a continuation of application No. 08/533,153, Sep. 20, 1995, abandoned.

[51] Int. Cl.$^6$ .................................................. F25B 33/00
[52] U.S. Cl. .............................................. 62/497; 62/480
[58] Field of Search ........................... 62/476, 148, 480, 62/497

[56] References Cited

U.S. PATENT DOCUMENTS

| | | |
|---|---|---|
| 1,877,536 | 9/1932 | Ruckelshaus et al. . |
| 1,881,568 | 10/1932 | Henney ..................................... 62/480 |
| 2,138,685 | 11/1938 | Altenkirch . |
| 2,326,160 | 8/1943 | Kleen ........................................ 62/179 |
| 2,338,712 | 1/1944 | Kleen ........................................ 62/480 |
| 2,496,459 | 2/1950 | Kleen ........................................... 62/5 |
| 2,624,182 | 1/1953 | Gross ......................................... 62/118 |
| 4,312,640 | 1/1982 | Verrando ..................................... 55/33 |
| 4,312,641 | 1/1982 | Verrando et al. . |
| 4,399,341 | 8/1983 | Yasuoka . |
| 4,571,473 | 2/1986 | Wyslouzil et al. . |
| 4,581,049 | 4/1986 | Januschkowetz ......................... 62/480 |
| 4,742,868 | 5/1988 | Mitani et al. ....................... 165/104.12 |
| 4,884,626 | 12/1989 | Filipowski . |
| 4,889,965 | 12/1989 | Gervais et al. . |
| 4,928,207 | 5/1990 | Chrysler et al. . |
| 4,944,159 | 7/1990 | Crozat ....................................... 62/112 |

(List continued on next page.)

FOREIGN PATENT DOCUMENTS

| | | |
|---|---|---|
| 0 037 643 A1 | 10/1981 | European Pat. Off. . |
| 0 091 382 A1 | 10/1983 | European Pat. Off. . |
| 2 651 621 A1 | 3/1991 | France . |
| 2666141 | 2/1992 | France ........................... F25B 27/00 |
| 2 689 220 A1 | 10/1993 | France . |
| 2 703 763 A1 | 10/1994 | France . |
| 2 736 421 A1 | 1/1997 | France . |
| 2 604 100 A1 | 12/1998 | France . |
| 4113042 | 10/1992 | Germany ........................ F25B 30/04 |
| WO/97/11323 | 3/1997 | WIPO . |

OTHER PUBLICATIONS

Buffington, R.M., Absorption Refrigeration with Solid Absorbents, Sep. 1993, 7 pages, Electrolux Servel Laboratories, New York, N.Y.

Vasiliev, L. et al., Waste Heat Driven Solid Sorption Coolers, Date Unknown, 9 pages.

Iloeje, O.C., Design Construction and Test Run of a Solar Powered Solid Absorption Refigerator, Sep. 6, 1984, pp. 447–455, Pergamon Press Ltd., U.S.A.

*Primary Examiner*—William Doerrler
*Attorney, Agent, or Firm*—Conley, Rose & Tayon, P.C.; Mark L. Berrier

[57] ABSTRACT

An absorbent pair refrigeration system comprising a source of liquid refrigerant; an evaporator for transforming the liquid refrigerant into vapor refrigerant at a lower temperature than the liquid refrigerant to thereby provide a desired cooling effect; a volume of absorbent in communication with the evaporator, wherein the vapor refrigerant is absorbed onto the absorbent; an electromagnetic wave generator for desorbing the vapor refrigerant from the sorbent without appreciably heating the absorbent; and a condenser in communication with the absorbent for condensing the vapor refrigerant which has been desorbed from the absorbent.

7 Claims, 3 Drawing Sheets

U.S. PATENT DOCUMENTS

| | | | |
|---|---|---|---|
| 4,976,117 | 12/1990 | Crozat et al. | 62/480 |
| 5,021,620 | 6/1991 | Inumada . | |
| 5,025,635 | 6/1991 | Rockenfeller et al. | 62/106 |
| 5,027,607 | 7/1991 | Rockenfeller et al. | 62/106 |
| 5,088,302 | 2/1992 | Tomizawa et al. . | |
| 5,161,389 | 11/1992 | Rockenfeller et al. | 62/480 |
| 5,165,247 | 11/1992 | Rockenfeller et al. | 62/77 |
| 5,179,259 | 1/1993 | Martin | 219/10.55 A |
| 5,216,327 | 6/1993 | Myers et al. . | |
| 5,220,804 | 6/1993 | Tilton et al. . | |
| 5,222,543 | 6/1993 | Carlstrom et al. . | |
| 5,223,809 | 6/1993 | Myer . | |
| 5,227,598 | 7/1993 | Woodmansee et al. . | |
| 5,271,239 | 12/1993 | Rockenfeller et al. | 62/259.2 |
| 5,274,347 | 12/1993 | Bobadilla . | |
| 5,291,942 | 3/1994 | Ryan | 62/480 |
| 5,300,901 | 4/1994 | Krümmel et al. . | |
| 5,333,471 | 8/1994 | Yamada | 62/476 |
| 5,442,931 | 8/1995 | Ryan et al. | 62/101 |
| 5,490,398 | 2/1996 | Cline | 62/497 |
| 5,522,452 | 6/1996 | Mizuno et al. . | |
| 5,855,121 | 1/1999 | Byrd et al. | 62/497 |

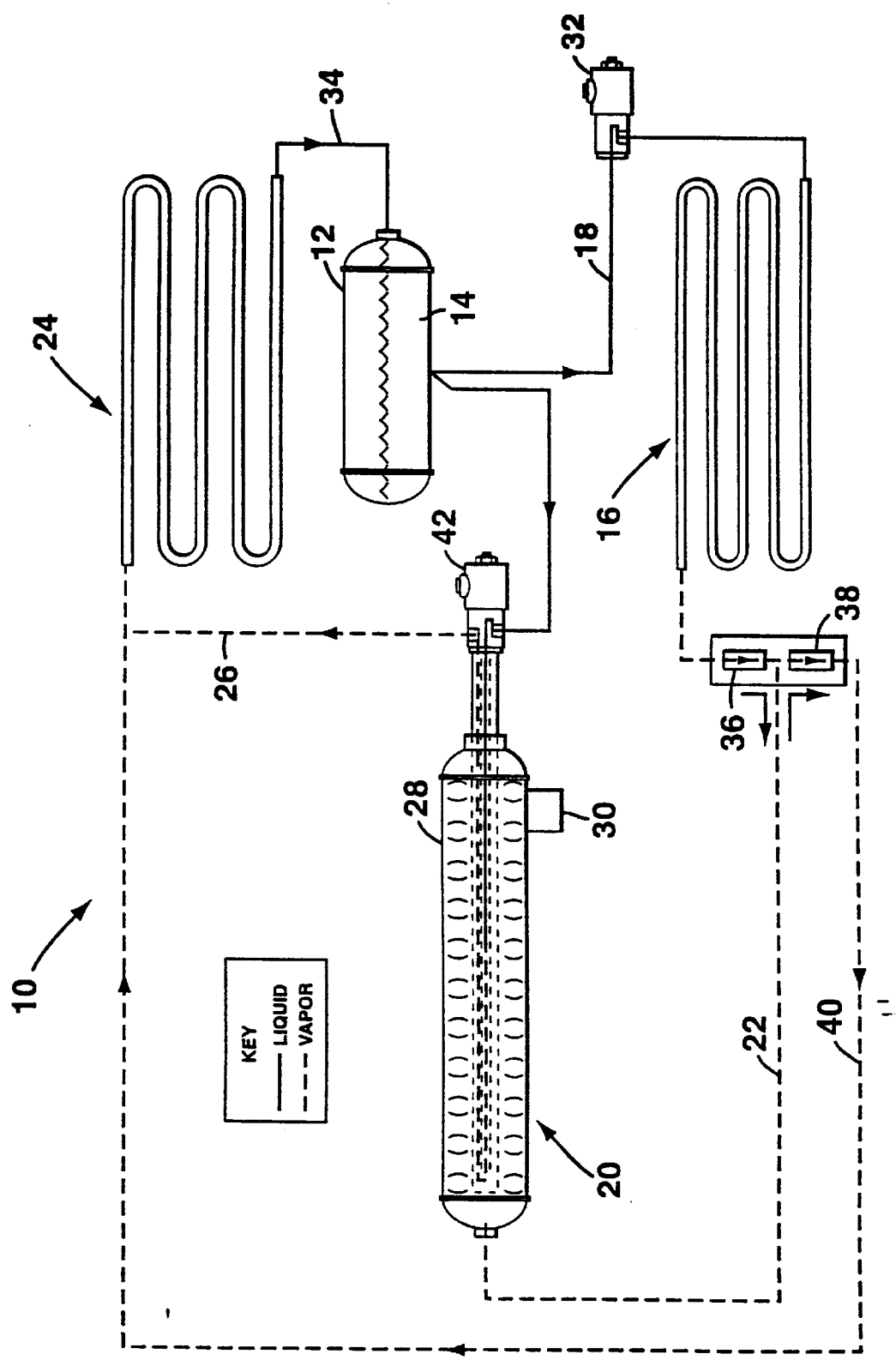
FIG_1 (PRIOR ART)

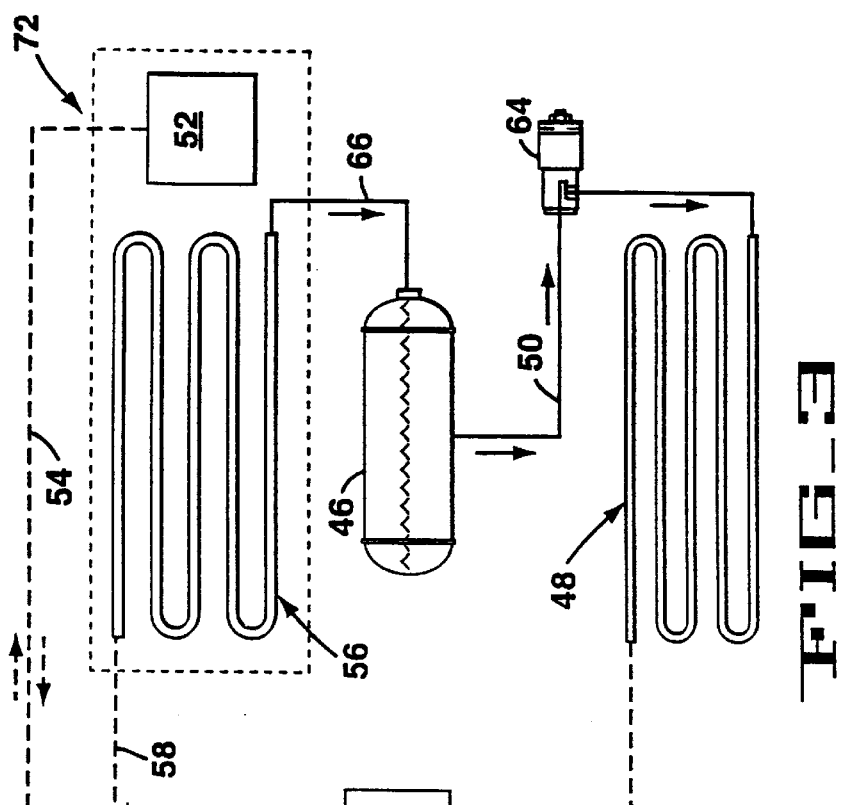
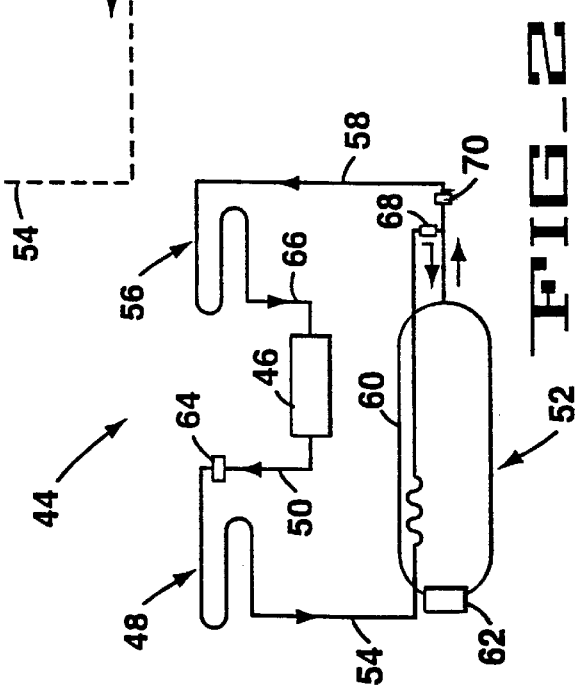

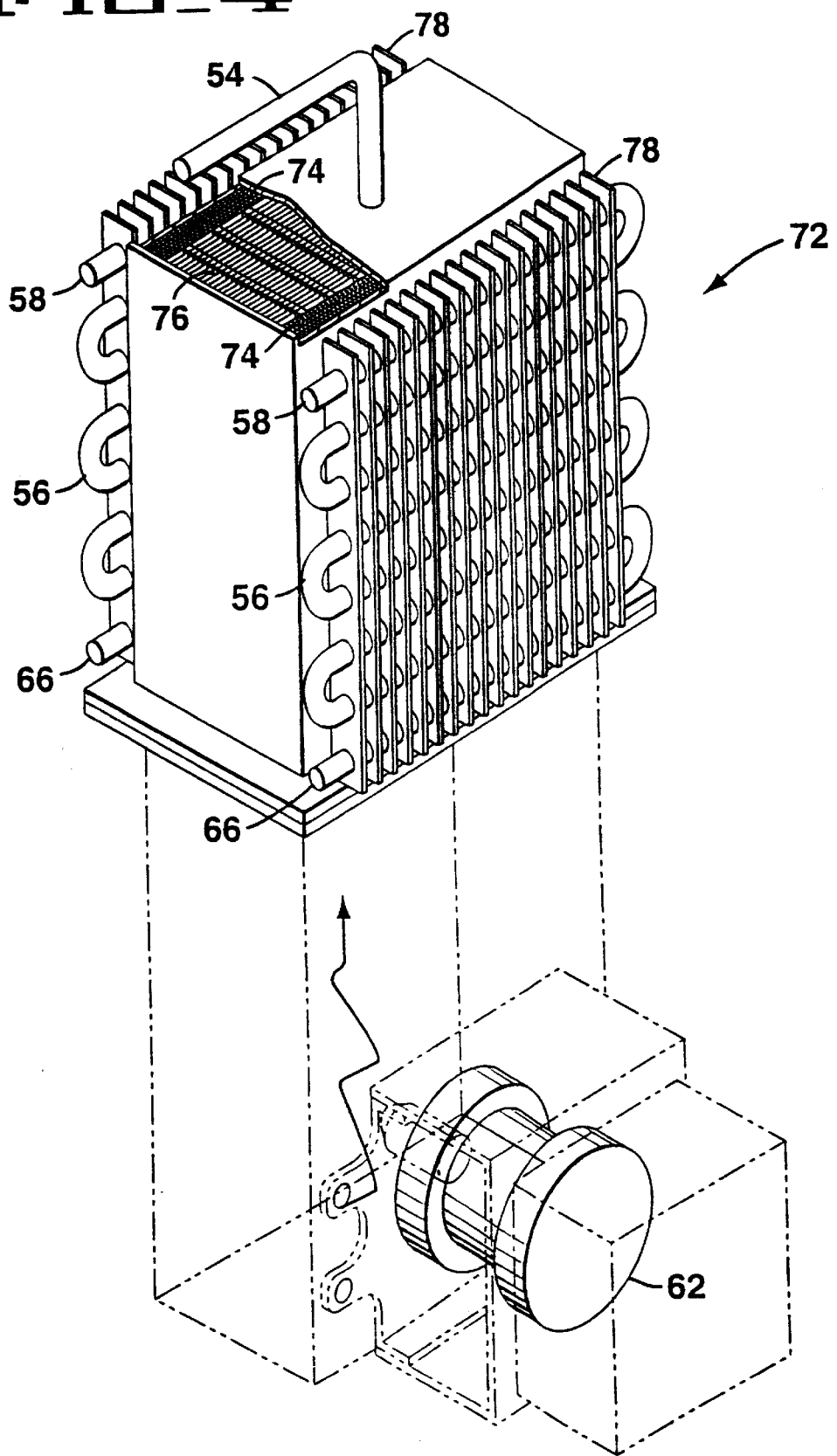
FIG_4

ABSORBENT PAIR REFRIGERANT SYSTEM

RELATED APPLICATIONS

This is a continuation of U.S. patent application Ser. No. 08/811,759 filed on Mar. 6, 1997, U.S. Pat. No. 5,855,121 which is a continuation of U.S. patent application Ser. No. 08/533,153 filed on Sep. 20, 1995, now abandoned.

BACKGROUND OF THE INVENTION

1. Field of the Invention

The present invention relates to an absorbent pair refrigeration system wherein the refrigerant is desorbed from a complex compound comprised of the refrigerant and a chemical absorbent using electromagnetic wave energy, and in particular microwave energy.

2. Description of the Relevant Art

Existing absorbent pair refrigeration systems utilize a gaseous refrigerant which is alternately adsorbed onto and desorbed from a chemical absorbent. The refrigerant and absorbent are referred to as absorbent pairs, and a complex compound is formed by adsorption of the refrigerant onto the absorbent. In typical systems, a refrigerant comprised of a low pressure polar gas, which has been vaporized in an evaporator, is adsorbed onto an absorbent comprised of an inert solid metal salt. Once the refrigerant has been fully adsorbed, the complex compound comprised of the refrigerant and the salt is heated to drive off the refrigerant. The resulting high-pressure refrigerant gas is then directed to a condenser, where it is converted back into a liquid phase. The high-pressure liquid refrigerant is then directed to the evaporator, wherein the refrigerant is evaporated and heat is adsorbed by the refrigerant from the atmosphere to provide the desired cooling effect.

In these prior art systems, an electrical or gas powered heater is used to heat the complex compound in order to drive off the refrigerant. The heat is transferred to the complex compound primarily through conduction, and the canister which contains the absorbent and in which the adsorption and desorption reactions occur is typically constructed of metal to aid in the transfer of heat. The combination of the canister, the absorbent and the heater is commonly called a sorber. The canister is usually provided with internal metal fins or other similar conductive means to segment the absorbent to thereby shorten the thermal diffusion path length between the wall of the canister and the absorbent to further aid in the transfer of heat to the complex compound.

During the desorption reaction, the sorber adsorbs a substantial amount of sensible heat, which must then be rejected prior to the adsorption reaction so that the absorbent is sufficiently cooled to enable it to reabsorb the refrigerant. This sensible heat reduces the COP of the refrigeration system and increases the cycle time between the desorption and adsorption reactions, thereby reducing the cooling capacity of the absorbent pairs. Furthermore, prior art systems often employ extraneous cooling means to cool the sorber during the cycle between the desorption and adsorption reactions, which is referred to as the letdown or cooling cycle. These means include using cooling fins attached to the exterior of the canister and running refrigerant through tubing through the core of the sorber. Both of these means add complexity and cost to the sorber design.

SUMMARY OF THE INVENTION

Therefore, it is an object of the present invention to provide an absorbent pair refrigeration system wherein the desorption reaction does not rely primarily on heating the complex compound conductively, wherein a relatively small amount of sensible heat is absorbed by the sorber and wherein the letdown cycle time is minimized.

According to the present invention, these and other objects and advantages are achieved by providing an absorbent pair refrigeration system comprising a receiver or reservoir containing liquid refrigerant under pressure, an evaporator downstream of the receiver for evaporating the refrigerant and providing the desired cooling effect, a canister downstream of the evaporator which contains a chemical absorbent into which the gaseous refrigerant is adsorbed to thereby form a complex compound, an electromagnetic wave generator means, such as a microwave generator, for desorbing the refrigerant from the complex compound, and a condenser downstream of the canister and upstream of the receiver for condensing the resulting pressurized vapor refrigerant into the pressurized liquid refrigerant.

Thus, the present invention uses microwave radiation to desorb the refrigerant from the absorbent. Consequently, conductive, radiative and convective modes of heating the complex compound are not required. Instead of heating the complex compound, the intermolecular friction of dipolar rotation induced by the microwave energy is used to break the chemical bond between the refrigerant and the absorbent. Thus, the present invention allows for a direct transfer of energy to the refrigerant/absorbent bond, which reduces or eliminates the amount of sensible heat adsorbed by the sorber and thereby greatly improves the COP and cooling capacity of the system.

These and other objects and advantages of the present invention will be made apparent from the following detailed description, with reference to the accompanying drawings.

BRIEF DESCRIPTION OF THE DRAWINGS

FIG. 1 is a schematic diagram of a prior art absorbent pair refrigeration system;

FIG. 2 is a schematic diagram of one embodiment of an absorbent pair refrigeration system according to the present invention;

FIG. 3 is a schematic diagram of another embodiment of an absorbent pair refrigeration system according to the present invention; and FIG. 4 is a perspective view of a portion of the invention depicted in FIG. 3.

DETAILED DESCRIPTION OF THE PREFERRED EMBODIMENTS

A brief review of the prior art will help in understanding the present invention. Referring to FIG. 1, a prior art absorbent pair refrigeration system, indicated generally by reference number 10, is shown to comprise a reservoir or receiver 12 filled with an appropriate refrigerant 14, an evaporator 16 connected to an outlet of receiver 12 via tubing 18, a sorber 20 in communication with the discharge end of evaporator 16 via tubing 22, and a condenser 24 connected to an outlet of sorber 20 via tubing 26. Sorber 20 comprises a canister 28, a chemical absorbent (not shown) contained within canister 28, and a heater 30.

During operation of refrigeration system 10, pressurized liquid refrigerant 14 is controllably discharged into evaporator 16 through operation of a thermal expansion valve, or TEV, 32. As the pressure of the refrigerant rapidly decreases, the temperature of the refrigerant is reduced and the refrigerant changes from the liquid to the vapor state, as is known by those skilled in the art. Evaporator 16 is typically located in or adjacent a cooling chamber, and the ambient heat is absorbed by the vapor refrigerant to thereby cool the cooling chamber. The vapor refrigerant is then directed through tubing 22 to sorber 20 and adsorbed onto the chemical absorbent contained within canister 28. Due to the affinity between the absorbent and the vapor refrigerant, during the adsorption reaction the vapor refrigerant is drawn through tubing 22 to thereby maintain a relatively low pressure in evaporator 16. After a sufficient amount of vapor refrigerant is adsorbed onto the chemical absorbent, which amount is controlled by TEV 32 based upon the temperature of evaporator 16, heater 30 is activated to initiate the desorb reaction, during which the complex compound is heated to thereby drive off the vapor refrigerant from the absorbent. The heat energizes the molecules of the refrigerant to a degree sufficient to break the chemical bond between the refrigerant and the absorbent. The resulting heated, pressurized vapor refrigerant is forced through tubing 26 to condenser 24, wherein the heat of the vapor refrigerant is expelled into the atmosphere and the refrigerant consequently changes from the vapor to the liquid state, which reduces the pressure of the refrigerant somewhat and causes more vapor refrigerant to be drawn from sorber 20 into condenser 24. The liquid refrigerant is then drained into receiver 12 via tubing 34. A check valve 36 in tubing 22 prevents the pressurized vapor from returning to evaporator 16. The pressurized vapor refrigerant in tubing 22 is instead forced through a check valve 38, through tubing 40 and into condenser 24. During the letdown or cooling cycle, which occurs after the desorb reaction and prior to the adsorb reaction, liquid refrigerant from receiver 12 may be controllably directed to the core of sorber 20 through operation of a TEV 42 to aid in cooling the absorbent.

Referring to FIG. 2, the absorbent pair refrigeration system according to the present invention will now be described. The refrigeration system of the present invention, indicated generally by reference number 44, is shown to comprise a reservoir or receiver 46 filled with an appropriate refrigerant, an evaporator 48 connected to an outlet of receiver 46 via appropriate tubing 50, a sorber 52 in communication with the discharge end of evaporator 48 via tubing 54, and a condenser 56 connected to sorber 52 via tubing 58. According to the present invention, sorber 52 comprises a canister 60, a chemical absorbent contained within canister 60, and an electromagnetic wave generator means 62 for desorbing the refrigerant from the complex compound.

Electromagnetic wave generator 62 is preferably either a thermionic or a solid state microwave generating device, such as a magnetron, klystron or a traveling wave tube. The microwaves produced by generator 62 are preferably in the standard ISM bands: 915 MHz (896 MHz in the United Kingdom), 2.45 GHz (S band), or 5.8 GHz (J band). In addition, the microwaves are delivered to a resonant cavity, which is comprised of canister 60 or into which canister 60 is placed, by any suitable microwave conducting means (not shown), such as wave guides, coaxial lines, electrodes or microstriplines. A ferrite circulator, mixing circuit or other suitable device is preferably used to couple generator 62 to the load. The input to generator 62 may also be modulated to match the radio frequency output to the load.

In operation of refrigeration system 44, liquid refrigerant from reservoir 46 is preferably controllably discharged into evaporator 48 through operation of a TEV 64 or similar means. The liquid refrigerant is evaporated in evaporator 48 to provide the desired cooling effect. The resulting vapor refrigerant is then drawn into sorber 52, wherein the vapor refrigerant is adsorbed onto the absorbent. Once the adsorption reaction is complete, generator 62 is activated to begin the desorption reaction. Up to the point when generator 62 is activated, the operation of refrigeration system 44 is similar to the operation of the prior art refrigeration system 10 described above. When generator 62 is activated, the intermolecular friction of dipolar rotation induced by the microwave energy breaks the chemical bond between the refrigerant and the absorbent. The resulting heated, pressurized vapor refrigerant is then forced into condenser 56, where it is condensed into the liquid state. The liquid vapor is then returned to reservoir 46 via tubing 66. A check valve 68 is ideally provided in tubing 54 to prevent the pressurized vapor refrigerant from returning to evaporator 48 during the desorption reaction. In addition, a check valve 70 may be provided in tubing 58 to prevent the refrigerant from returning to sorber 52 during the adsorption reaction.

While a variety of refrigerants and chemical absorbents may be used in conjunction with the present invention, the preferred embodiment of the invention contemplates the use of a refrigerant such as ammonia, methane or alcohol, and an inert metal halide salt, such as SrBr2, as the absorbent. The metal halide salt has a low dielectric constant which allows the absorbent to experience the desorption reaction without being appreciably heated by the applied microwave radiation. Consequently, the absorbent does not require a cooling cycle after the desorption reaction and is immediately ready to begin the adsorption reaction. In addition, the duration of the desorption phase may be made arbitrarily short by providing sufficient microwave generator and heat rejection capability.

Furthermore, the absorption reaction is exothermic, and the reaction rate decreases with increasing temperature. Accordingly, in another embodiment of the invention (not shown), a refrigerant line from the evaporator may pass through the absorbent to absorb heat and keep the reaction operating efficiently. Alternatively, an air-cooled heat sink may be used to cool the absorbent.

Referring to FIGS. 3 and 4, another embodiment of the present invention is shown, wherein the same reference numbers are used to denote elements similar to those described with reference to FIG. 2. In this embodiment, the condenser 56 and sorber 52 are combined together into a cooling engine 72. In operation, liquid refrigerant is directed from receiver 46 to evaporator 48. The vapor refrigerant from evaporator 48 is then drawn to cooling engine 72, which provides a pressure sink due to the absorption of the vapor refrigerant onto the absorbent 74. The absorbent 74 is preferably held in place with a porous material 76, such as a porous polymer (polymer PTFE), which allows the vapor refrigerant to pass through and effectively mix with the absorbent. Porous material 76 also preferably compresses, but does not permanently deform, in response to the increased pressure caused by the expansion of the absorbent during the absorption reaction. After the load to be cooled is cooled to the desired temperature, microwave generator 62 excites the refrigerant in cooling engine 72, thereby driving it from the absorbent to the condenser section 56 of cooling engine 72. The refrigerant then condenses and collects in receiver 46. The process then repeats according to the above description.

FIG. 4 depicts cooling engine 72 as it would be inserted between microwave generator 62 and the microwave cavity. Alternatively, engine 72 can be constructed as an integral part of the microwave cavity. Cooling fins 78 on cooling engine 72 serve to help condense the refrigerant and remove the heat of absorption from the absorbent. Fins 78 are preferably cooled by the same fan used to cool the components of microwave generator 62.

As an example of the operation of refrigeration system 44, assume 250 ml of volume is available within a 900 W microwave oven cabinet for cooling engine 72. Over a four minute period, cooling engine 72 can provide approximately 400 W of cooling, after which it would need to recharge for approximately three minutes. After the recharge period, refrigeration system 44 is immediately ready to cool for another four minute period. If continuous cooling is desired, the absorbent may be divided into two separate sections which are alternately excited by microwave generator 62. In essence, generator 62 would continuously cycle one volume or the other. By doing so, the duty cycle of generator 62 is increased, thereby raising the cooling power level of cooling engine 72.

In another embodiment of the invention particularly applicable to cryogenic cooling, a cryogen such as methane may be used as the refrigerant in conjunction with cooling engine 72. In this manner, a closed circuit cryogenic cooling of superconducting magnets, electronic components and the like may be achieved.

In yet another embodiment of the invention, the refrigeration system 44 may be combined with a conventional microwave oven to provide an appliance capable of both heating and cooling. In this embodiment, the microwave generator of the microwave oven is used to desorb the refrigerant from the absorbent. Thus, a single microwave generator may be used to effect both heating and cooling. In this embodiment, suitable wave guides and shuttering means are provided to direct the microwaves into either the microwave cavity, when heating is desired, or the sorber, when cooling is desired.

It should be recognized that, while the present invention has been described in relation to the preferred embodiments thereof, those skilled in the art may develop a wide variation of structural details without departing from the principles of the invention. Therefore, the appended claims are to be construed to cover all equivalents falling within the true scope and spirit of the invention.

What is claimed is:

1. An absorbent pair refrigeration system comprising:
   a source of liquid refrigerant;
   an evaporator for transforming the liquid refrigerant into vapor refrigerant at a lower temperature than the liquid refrigerant to thereby provide a cooling effect;
   a volume of chemical absorbent in communication with the evaporator;
   wherein the vapor refrigerant is absorbed onto the chemical absorbent to form a refrigerant/absorbent compound;
   an electromagnetic wave generator for desorbing the refrigerant from the refrigerant/absorbent compound; and
   a condenser in communication with the chemical absorbent for condensing the vapor refrigerant which has been desorbed from the refrigerant/absorbent compound;
   wherein the refrigerant/absorbent compound is not heated by the electromagnetic wave generator to a degree sufficient to thermally desorb the refrigerant from the refrigerant/absorbent compound.

2. The absorbent pair refrigeration system of claim 1, wherein the chemical absorbent is a metal halide salt.

3. The absorbent pair refrigeration system of claim 2, wherein the chemical absorbent is strontium bromide and the refrigerant is ammonia.

4. A refrigeration system comprising:
   a refrigerant;
   an evaporator for evaporating the refrigerant to provide a cooling effect;
   a sorbent in communication with the evaporator wherein the sorbent and the refrigerant from the evaporator combine in a sorption reaction;
   an electromagnetic wave generator for desorbing the refrigerant from the sorbent wherein electromagnetic energy from the electromagnetic wave generator is converted into work which acts to separate the refrigerant from the sorbent in a primarily isothermal reaction; and
   a condenser in communication with the sorbent for condensing the refrigerant which has been desorbed from the sorbent.

5. The refrigeration system of claim 4, wherein the sorbent is a metal halide salt.

6. The refrigeration system of claim 5, wherein the sorbent is strontium bromide and the refrigerant is ammonia.

7. The refrigeration system of claim 4 wherein the evaporator is configured to provide a portion of said cooling effect to said sorbent to accelerate the sorption reaction.

* * * * *